(12) United States Patent
Dooper et al.

(10) Patent No.: US 11,901,814 B2
(45) Date of Patent: Feb. 13, 2024

(54) ADAPTIVE DC-DC BOOST CONVERTER ARRANGEMENT

(71) Applicant: SHENZHEN GOODIX TECHNOLOGY CO., LTD., Shenzhen (CN)

(72) Inventors: Lutsen Dooper, Nijmegen (NL); Han Martijn Schuurmans, Nijmegen (NL); Maarten Wilhelmus Henricus Marie Dommelen Van, Nijmegen (NL); Bernardus Henricus Krabbenborg, Nijmegen (NL); Ivo Johannes Petrus Moolenaar, Nijmegen (NL)

(73) Assignee: SHENZHEN GOODIX TECHNOLOGY CO., LTD.

( * ) Notice: Subject to any disclaimer, the term of this patent is extended or adjusted under 35 U.S.C. 154(b) by 316 days.

(21) Appl. No.: 17/364,352

(22) Filed: Jun. 30, 2021

(65) Prior Publication Data

US 2022/0006378 A1    Jan. 6, 2022

(30) Foreign Application Priority Data

Jul. 1, 2020  (EP) .................................... 20183394

(51) Int. Cl.
   *H03F 1/02*   (2006.01)
   *H02M 3/04*   (2006.01)
   (Continued)

(52) U.S. Cl.
   CPC .............. *H02M 3/04* (2013.01); *H02M 1/44* (2013.01); *H03F 1/02* (2013.01); *H03F 3/20* (2013.01)

(58) Field of Classification Search
   CPC .......... H02M 3/04; H02M 1/44; H02M 3/003; H02M 1/14; H02M 3/155; H02M 3/07;
   (Continued)

(56) References Cited

U.S. PATENT DOCUMENTS

| 4,823,296 A | 4/1989 | Millar |
| 10,609,477 B1 * | 3/2020 | Chadha .................. H03F 3/217 |

(Continued)

FOREIGN PATENT DOCUMENTS

| CN | 101662262 A | 3/2010 |
| CN | 102403964 A | 4/2012 |
| CN | 110504927 A | 11/2019 |

OTHER PUBLICATIONS

Sun et al., Measurement Investigation on Acoustic Noise Caused by "Singing" Capacitors on Mobile Devices, 2019 IEEE International Symposium on Electromagnetic Compatibility Laboratory Missouri University of Science and Technology, six (6) pages.

*Primary Examiner* — Hieu P Nguyen
(74) *Attorney, Agent, or Firm* — Emerson, Thomson & Bennett, LLC; Roger D. Emerson; Peter R. Detorre

(57) ABSTRACT

An adaptive DC-DC boost converter arrangement and an electronic circuit including such an arrangement are provided. The arrangement includes a circuit board with a plurality of electronic components mounted thereon, implementing an adaptive DC-DC boost converter circuit and a boost decoupling capacitor. The adaptive DC-DC boost converter circuit comprises a DC-DC boost converter having a converter set value input, a boost supply input, and a boost voltage output, and an adaptive DC-DC boost control unit having a control input and a control output. An acoustical noise suppression filter is present having a filter input connected to the control output of the adaptive DC-DC boost control unit and a filter output connected to the converter set value input of the DC-DC boost converter.

19 Claims, 5 Drawing Sheets

(51) Int. Cl.
*H02M 1/44* (2007.01)
*H03F 3/181* (2006.01)
*H03F 3/20* (2006.01)

(58) Field of Classification Search
CPC .... H02M 1/12; H03F 1/02; H03F 3/20; H03F 2200/03; H03F 2200/372; H03F 1/0227; H03F 3/181; H03F 1/26; H05K 2201/10015; H05K 2201/1006; H05K 1/0216; H05K 1/0233; G05F 1/10; H01G 4/012; H01G 4/12; H01G 4/30; H01G 4/35; H01G 4/38; H01G 4/40
USPC .................................................. 330/297, 136
See application file for complete search history.

(56) References Cited

U.S. PATENT DOCUMENTS

| | | |
|---|---|---|
| 2014/0155002 A1 | 6/2014 | Dakshinamurthy et al. |
| 2015/0116891 A1 | 4/2015 | Park et al. |
| 2016/0363952 A1 | 12/2016 | Garrone et al. |
| 2018/0182554 A1 | 6/2018 | Park et al. |
| 2018/0375476 A1 | 12/2018 | Balteanu et al. |

* cited by examiner

ADAPTIVE DC-DC BOOST CONVERTER ARRANGEMENT

CROSS REFERENCE TO RELATED APPLICATION

The present disclosure claims priority to European application No. 20183394.4 filed on Jul. 1, 2020, which is hereby incorporated by reference in its entireties.

FIELD OF THE DISCLOSURE

The present disclosure relates to an adaptive DC-DC boost converter arrangement, comprising a circuit board with a plurality of electronic components mounted thereon, the plurality of electronic components comprising an adaptive DC-DC boost converter circuit and a boost decoupling capacitor connected to an output of the adaptive DC-DC boost converter circuit.

BACKGROUND ART

In many electronic devices, DC-DC boost converters are used to boost a supply voltage, e.g. in battery operated devices, in order to adapt a low battery voltage to a higher supply voltage. This is efficient from an energy efficiency viewpoint, as the supply voltage can be adapted when it is needed only. However, the often used decoupling capacitors in such DC-DC boost converters may lead to unwanted acoustic noise being generated by the electronic device.

International patent publication WO2015/105719 discloses a technique for acoustic noise cancellation using a device having multi-layer ceramic capacitors. In a circuit, one capacitor is coupled to a ground reference, and the other capacitor is coupled to a supply voltage. The multi-layer ceramic capacitor is made of materials such that the capacitor package does not change shape or vibrate in response to voltage level fluctuations.

US patent publication U.S. Pat. No. 9,615,460 discloses a circuit board device for reducing acoustic noise. A specific PCB board layout is presented with two capacitor packaging areas on either side of the PCB in a back-to-back manner.

SUMMARY

The present disclosure seeks to provide a solution to suppress audible noise originating from a ceramic capacitor included on a (printed) circuit board when applying an AC signal.

According to the present disclosure, an adaptive DC-DC boost converter arrangement is provided as defined above, further comprising a DC-DC boost converter having a converter set value input, a boost supply input, and a boost voltage output, an adaptive DC-DC boost control unit having a control input and a control output, and an acoustical noise suppression filter having a filter input connected to the control output of the adaptive DC-DC boost control unit, and a filter output connected to the converter set value input of the DC-DC boost converter.

The present disclosure embodiments have the advantage that the adaptive DC-DC boost converter arrangement can be used in an electronic circuit using simple board circuitry with low costs, low complexity layout requirements, and minimal dimensions. It provides a more simple solution for suppressing audible noise originating from a ceramic capacitor, whilst maintaining the capability of boosting the supply voltage for e.g. high amplifier output power applications.

In a further aspect, the present disclosure relates to an electronic circuit comprising an adaptive DC-DC boost converter arrangement according to any one of the embodiments described herein.

BRIEF DESCRIPTION OF DRAWINGS

The present disclosure will be discussed in more detail below, with reference to the attached drawings, in which.

DESCRIPTION OF EMBODIMENTS

Figure 1:
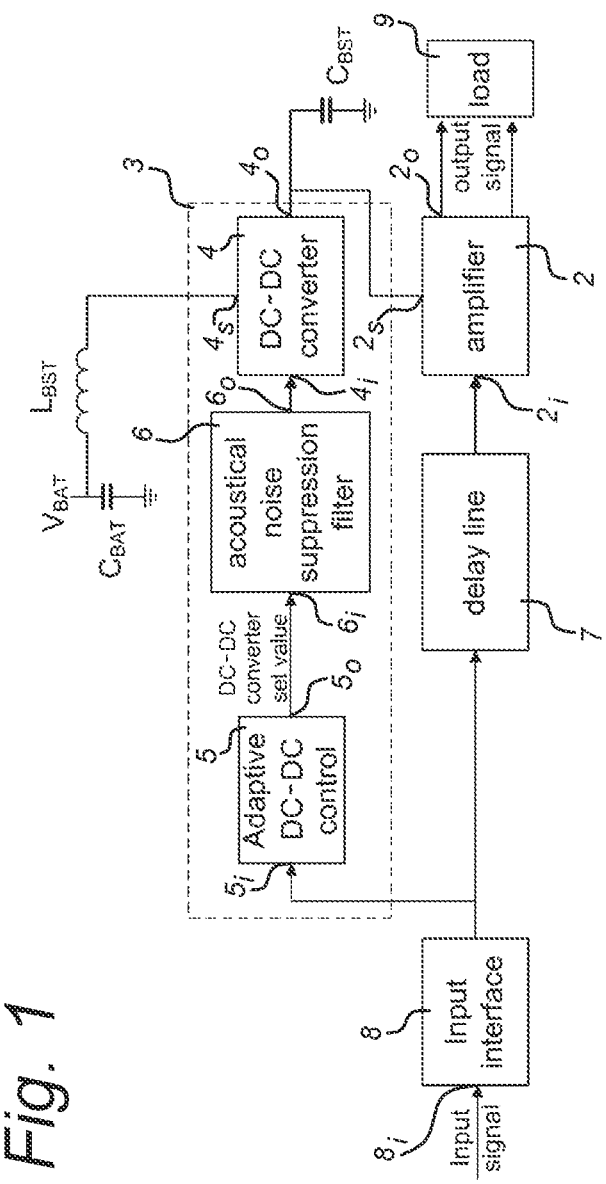
FIG. 1 shows a schematic diagram of an electronic circuit using an adaptive DC-DC boost converter arrangement according to an embodiment of the present disclosure.

Audio amplifiers in mobile applications use an internal DC-DC boost converter to boost a supply voltage, enabling a high amplifier output power. The internal DC-DC boost converter increases the battery voltage to a higher voltage in the amplifiers allowing to drive more power into its load. Since the internal DC-DC boost converter only boosts the supply voltage when it is necessary, this reduces the power consumption from the battery, thereby improving the battery life. Furthermore, with audio signals, the boost voltage follows the envelope of the audio signal, and will, therefore, continuously change in voltage in response to varying voltage demands.

Typically, such audio amplifiers also employ a DC-DC boost converter decoupling capacitor on the associated (printed) circuit board, allowing to drive an associated load (such as a speaker). Most audio amplifiers use ceramic capacitors as DC-DC boost converter decoupling capacitors, owing to their smaller size and lower costs whilst maintaining good performance. However, the drawback of using ceramic capacitors on a circuit board is the generation of audible noise, also known as acoustic noise, from the ceramic capacitors when, for example, applying an AC signal. This is typically known as 'capacitor singing'. The ceramic capacitor itself does not generate this audible noise, but it may vibrate, expand, and/or move in response to varying voltages applied, and, as a result, the ceramic capacitor may physically bring the circuit board into vibration. Although the capacitor movement is small, only about 1 pm-1 nm, the level of noise is still audible. Specific circuit board resonance frequencies generate most of the audible noise. These resonance frequencies are normally above 4 kHz, but may shift to lower frequencies if e.g. the physical size of the capacitors are larger.

Techniques are known in the art to suppress the effects of 'capacitor singing'. One technique is to use multi-layer ceramic capacitors, which are formed of materials such that the capacitor package does not change shape or vibrate in response to varying voltage demands, as e.g. disclosed in international patent publication WO2015/105719. However, multi-layer ceramic capacitors are typically more expensive than normal ceramic capacitors, driving up manufacturing costs. Another technique is to use a special PCB board layout with two capacitor packaging areas, on either side of the PCB, in a back-to-back manner, such as e.g. disclosed in US patent publication U.S. Pat. No. 9,615,460. Although this successfully reduces the audible noise, such a special PCB board layout often have more complex layout requirements, and also require more space, where the latter is of critical importance, especially in mobile applications. An alternative technique is to fix the internal DC-DC boost converter to a constant output voltage, thereby avoiding any varying voltage demands and suppressing audible noise, but this leads to efficiency losses and increased battery consumption.

As such, there is a need in the art to overcome these drawbacks, and provide a technique to suppress 'capacitor singing', with low costs and low complexity circuitry, whilst maintaining varying voltage demands with reliable operation.

The present disclosure embodiments provide an adaptive DC-DC boost converter arrangement to boost the supply voltage, whilst providing a simple solution to suppress the audible noise originating from decoupling capacitors, with low cost and simple (printed) board circuitry.

FIG. 1 shows a schematic diagram of an electronic circuit using an adaptive DC-DC boost converter arrangement, according to an exemplary embodiment of the present disclosure. In this exemplary embodiment, the electronic circuit is built around an amplifier 2, in further applications it can be a different type of electronic circuit, The adaptive DC-DC boost converter arrangement comprises a circuit board with a plurality of electronic components mounted thereon, the plurality of electronic components comprising an adaptive DC-DC boost converter circuit 3, and a boost decoupling capacitor $C_{bst}$ connected to an output of the adaptive DC-DC boost converter circuit 3. The circuit board may be a regular printed circuit board PCB, e.g. having an epoxy or ceramic base, or a flexible printed circuit (FPC). The adaptive DC-DC boost converter circuit 3 is arranged to boost the supply voltage to an amplifier 2 and thus reduce the power consumption of the battering supply. The battery supply in this exemplary embodiment is indicated as a battery capacitor $C_{BAT}$ having a battery voltage $V_{BAT}$ connected to the DC-DC boost converter circuit 3 via a boost inductor $L_{BST}$. In this exemplary embodiment, the amplifier 2 drives a load 9 (e.g. a speaker) and is arranged to receive an input signal via an input interface 8 and a delay line 7. The input interface 8 may receive an interface input $8_i$ from e.g. an external circuit or component.

The boost decoupling capacitor $C_{bst}$ may comprise, for example, of a ceramic capacitor connected directly to earth. This will reduce the level of high frequency noise in the output signal of the adaptive DC-DC boost converter circuit 3.

The adaptive DC-DC boost converter circuit 3 comprises a DC-DC boost converter 4, having a converter set value input $4_i$, a boost supply input $4_s$ and a boost voltage output $4_o$, and an adaptive DC-DC boost control unit 5 having a control input $5_i$ and a control output $5_o$. The adaptive DC-DC boost control unit 5 receives the control input $5_i$, and outputs the control output $5_o$. Similarly, the DC-DC boost converter 4 receives a converter set value input $4_i$ and a boost supply input $4_s$ from the battery supply, and outputs the corresponding boost voltage output $4_o$.

In a specific embodiment, the adaptive DC-DC boost control unit 5 is arranged to determine a converter set value for input to the converter set value input $4_i$ of the DC-DC boost converter 4, the converter set value being proportional to a signal level present on the control input $5_i$. In other wording, the adaptive DC-DC boost control unit 5 is arranged to calculate the converter set value input $4_i$ of the DC-DC boost converter 4, where the boost voltage output $4_o$ 'follows' the control input $5_i$, i.e. the converter set value is a time varying signal In the following description, the signal level present on a signal e.g. a control input, may comprise a voltage level or voltage amplitude. For example, if a high voltage level is present on the control input $5_i$, then the signal present on the boost voltage output $4_o$, being proportional to the control input $5_i$, will also have a high voltage level.

As a non-limiting example to describe the operation of the adaptive DC-DC boost converter circuit 3, the adaptive DC-DC boost control unit 5 receives a high voltage level present on the control input $5_i$, and thus, determines that the supply voltage is to be boosted. The adaptive DC-DC boost control unit 5 will, thereby, determine a high (DC-DC) converter set valve for input to the converter set value input $4_i$ i.e. it determines a high voltage level is required. The DC-DC boost converter 4 receives the converter set value input $4_i$ with an associated high (DC-DC) converter set value, where the associated high (DC-DC) converter set value was determined by the adaptive DC-DC boost control unit 5 owing to the high voltage level. The DC-DC boost converter 4 also receives the boost supply input $4_s$, and determines that the voltage level present on boost supply input $4_s$ is not sufficient in comparison to the high (DC-DC) converter set value determined by the adaptive DC-DC boost control unit 5. The DC-DC boost converter 4 may then, in combination with the boost decoupling capacitor $C_{bst}$, proceed to boost the voltage level present on the boost supply input $4_s$, leading to a high voltage level present on the signal of the boost voltage output $4_o$. As such, the adaptive DC-DC boost converter circuit 3, comprising the adaptive DC-DC boost control unit 5 and DC-DC boost converter 4, boosts the supply voltage, and thus, during actual use, reduces the power consumption of the battery supply.

In the embodiment shown in FIG. 1, the adaptive DC-DC boost converter circuit 3 further comprises an acoustical noise suppression filter 6, having a filter input $6_i$ connected to the control output $5_o$ of the adaptive DC-DC boost control unit 5 and a filter output $6_o$ connected to the converter set value input $4_i$ of the DC-DC boost converter 4. The acoustical noise suppression filter 6 is arranged to filter out resonance frequencies that leads to 'capacitor singing', i.e. resonance frequencies of the circuit board as described above, i.e. the technical effect of the acoustic noise suppression filter 6 is to prevent resonance, on the pm-nm level, of the circuit board, for resonance frequencies that are normally above 4 kHz, caused by e.g. an AC signal on the boost decoupling capacitor $C_{bst}$ mounted on the circuit board. The acoustic noise suppression filter 6 is connected in series with the adaptive DC-DC boost control unit 5 and DC-DC boost converter 4. In this regard, in combination with the feature of boosting the supply voltage during actual use, this presents an advantage over the present art, whereby this reduces 'capacitor singing' and, in tandem, reduces the power consumption of the battery supply.

In the embodiment shown in FIG. 1, the acoustic noise suppression filter 6 is positioned after the adaptive DC-DC boost control unit 5. This is due to the non-linear behaviour of the adaptive DC-DC boost control unit 5, which leads to additional high frequencies that can trigger the resonance of the boost decoupling capacitor $C_{bst}$. By placement of the acoustic noise suppression filter 6 after the adaptive DC-DC boost control unit 5, this enables the acoustic noise suppression filter 6 to suppress the additional high frequencies i.e. frequencies above e.g. 4 Khz generated by the adaptive DC-DC boost control unit 5.

Similarly, in the embodiment shown in FIG. 1, the acoustic noise suppression filter 6 is positioned before the DC-DC boost converter 4. This is to avoid additional costs, as placement of the acoustic noise suppression filter 6 between the DC-DC boost converter 4 and boost decoupling capacitor $C_{bst}$ would require external components e.g. inductances and capacitors of higher value and rating, which would lead to higher costs.

In more general wording, the present disclosure embodiments as described herein all relate to an adaptive DC-DC boost converter arrangement comprising a circuit board with a plurality of electronic components mounted thereon, the plurality of electronic components comprising an adaptive DC-DC boost converter circuit 3 and a boost decoupling capacitor $C_{bst}$ connected to an output of the adaptive DC-DC boost converter circuit 3. The adaptive DC-DC boost converter circuit 3 comprises a DC-DC boost converter 4 having a converter set value $4_i$, a boost supply input $4_s$ and a boost voltage output $4_o$, an adaptive DC-DC boost control unit 5 having a control input $5_i$ and a control output $5_o$, and an acoustic noise suppression filter 6 having a filter input $6_i$ connected to the control output $5_o$ of the adaptive DC-DC boost control unit 5 and a filter output $6_o$ connected to the converter set value input $4_i$ of the DC-DC boost converter 4. All the embodiments described provide an adaptive DC-DC boost converter arrangement to boost the supply voltage for e.g. high amplifier output power applications, with a simple, yet reliable solution to suppress audible noise originating from a decoupling capacitor, with a circuitry of low cost and low complexity, and layout requirements with minimal dimensions.

In an exemplary embodiment, the acoustical noise suppression filter 6 is a low pass filter. In this regard, the acoustical noise suppression filter 6 allows frequencies less than a specific cut-off frequency, to pass unaltered, and all other frequencies i.e. noise, being greatly altered and attenuated (pass bandwidth of 0 to x kHz). This reduces the audible noise generated by specific circuit board resonance frequencies.

In a further specific embodiment, the acoustic noise suppression filter 6 has a pass bandwidth of less than 4 kHz. In an exemplary embodiment, the acoustic noise suppression filter 6 has a pass bandwidth of less than (or equal to) about 1 kHz. The pass bandwidth can have a lowest frequency of 0 Hz (low-pass filter), or can be centred around a centre frequency, depending on the specific application. For example, an acoustic noise suppression filter 6 with a pass bandwidth from about 0 . . . 1 kHz (i.e. low-pass filter) will allow all frequencies equal to and less than 1 kHz to pass unaltered, and any signal with frequencies above 1 kHz are altered and greatly attenuated to filter out any possible noise. In another example, an acoustic noise suppression filter 6 with a pass bandwidth of 1 kHz, with a lower cut-off frequency $f_1$ of 2.5 kHz and an upper cut-off frequency $f_2$ of 3.5 kHz, would allow frequencies between 2.5 kHz and 3.5 kHz to pass unaltered, and any frequencies below 2.5 kHz and above 3.5 kHz are altered and attenuated, whereby the centre frequency is equal to $\sqrt{f_1 f_2}$ i.e. 3 kHz. In a further embodiment, the acoustical noise suppression filter 6 is a bandpass filter and an upper cut-off frequency of the bandpass filter is less than 4 kHz.

The exemplary size of the pass bandwidth of the acoustic noise suppression filter 6 is specific to the combination of e.g. the circuit board, the physical size of the boost decoupling capacitor $C_{bst}$, the form factor of the boost decoupling capacitor $C_{bst}$ and specific application. As stated above, in general, the specific circuit board resonance frequencies, which generate audible noise, are normally above 4 kHz, and, as such, an acoustic noise suppression filter 6 comprising a low-pass filter with a pass bandwidth from about 0 . . . 1 kHz greatly reduces the audible noise at 4 kHz and higher, without greatly attenuating the genuine signal comprising frequencies below 1 kHz.

In generic terms, the pass bandwidth is dependent on the physical size of the boost decoupling capacitor $C_{bst}$ in a further embodiment. More in particular, the physical size of the boost decoupling capacitor ($C_{bst}$) is inversely dependent on the pass bandwidth. As described above, if, for example, the physical size of the boost decoupling capacitor $C_{bst}$ is larger, the resonance frequencies may shift to lower frequencies, and thus, a lower-pass filter with smaller pass bandwidth may be required, for example, a pass bandwidth of less than 1 kHz. When the acoustic noise suppression filter is a bandpass filter, the bandpass filter with a lower centre frequency may be required.

For example, if a resonance frequency of 2 kHz needs to be suppressed, then the pass bandwidth can also be equal to 1 kHz, and the upper cut-off frequency can be 1.5 kHz and the lower cut-off frequency can be 0.5 kHz, which would allow frequencies between 0.5 kHz and 1.5 kHz to pass unaltered, and any frequencies below 0.5 kHz and above 1.5 kHz are altered and attenuated. All in all, the frequency of the audible noise isn't between the upper cut-off frequency and the lower cut-off frequency.

As another non-limiting example, for an amplifier 2 with an input frequency of 500 Hz, and for a boost coupling capacitor $C_{bst}$ comprising two (standard 0603) 10 μF ceramic capacitors (each of size 1.6×0.8 mm) in parallel, the audible noise has a resonance frequency at 4 kHz and 14 kHz, and a pass bandwidth of 1 kHz would be sufficient. If, in this given non-limiting example, the boost coupling capacitor $C_{bst}$ comprises a single (0805) 20 μF ceramic capacitor (of size 2×1.25 mm), the resonance frequencies may shift to lower frequencies.

Note in this respect that the DC-DC boost converter circuit 3 in the arrangement of FIG. 1 is arranged to follow the envelope of the input signal, which means that, without the acoustic noise suppression filter 6, the input signal and the amplified output signal (with respect to the boost supply input $4_s$) may have a frequency content in a range above the filter pass bandwidth.

Figure 2:
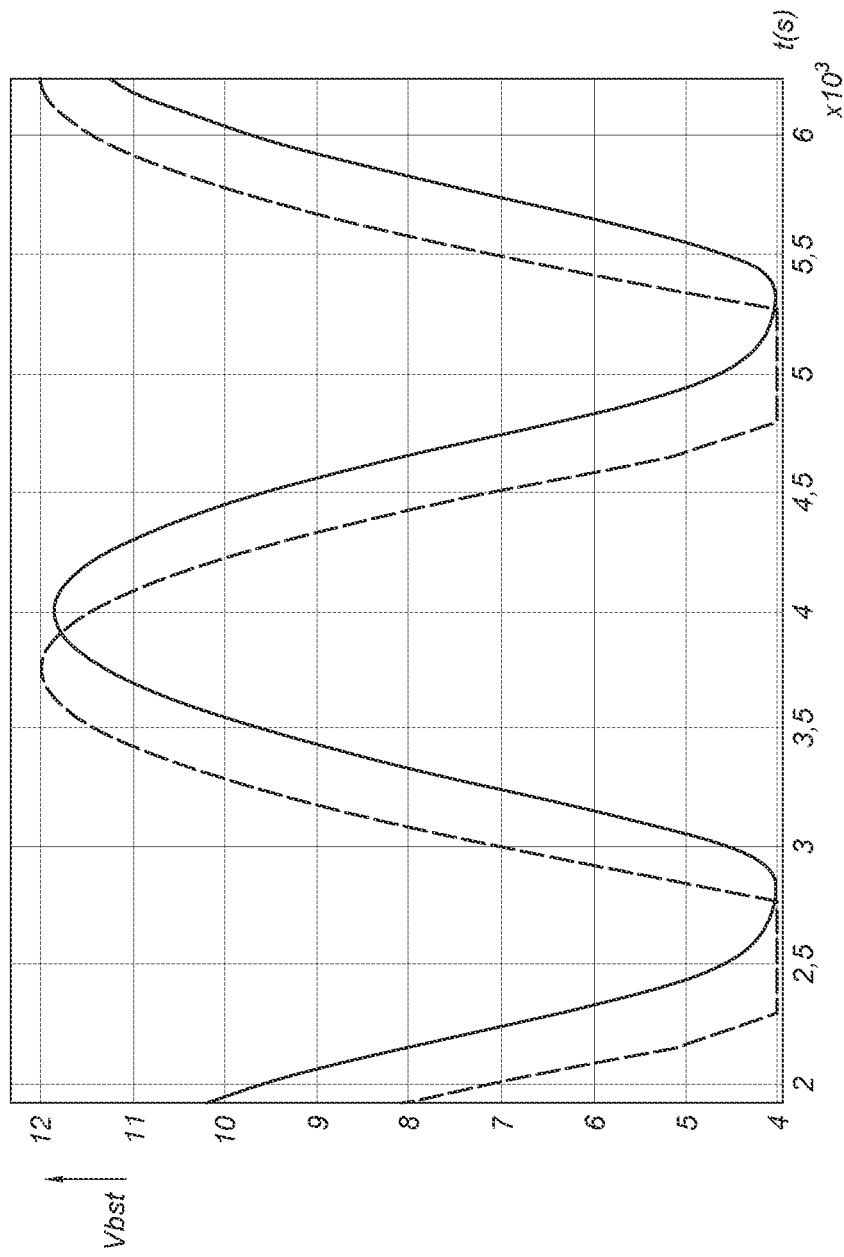
FIG. 2 shows a signal diagram of an exemplary input and output signal of the acoustical noise suppression filter as used in an adaptive DC-DC boost converter arrangement according to an embodiment of the present disclosure.

In an exemplary embodiment shown in FIG. 1, the acoustical noise suppression filter 6 is a fourth order low pass filter. The fourth order low pass filter allows to obtain a better defined attenuation characteristic with frequencies higher than the pass bandwidth than a low pass filter of lower order e.g. a first order low pass filter. In a non-limiting example, FIG. 2 shows a graph of an input signal and output signal of the acoustical noise suppression filter 6 as used in the adaptive DC-DC boost converter circuit 3 as shown in FIG. 1, with time on the horizontal axis and voltage amplitude on the vertical axis, and where the acoustical noise suppression filter 6 is a fourth order low pass filter with a pass bandwidth of 1 kHz. In view of FIG. 2, the dashed line represents an exemplary input signal i.e. unfiltered signal of the acoustical noise suppression filter 6, and the solid line represents an exemplary output signal i.e. filtered signal of the acoustical noise suppression filter 6.

Figure 3:
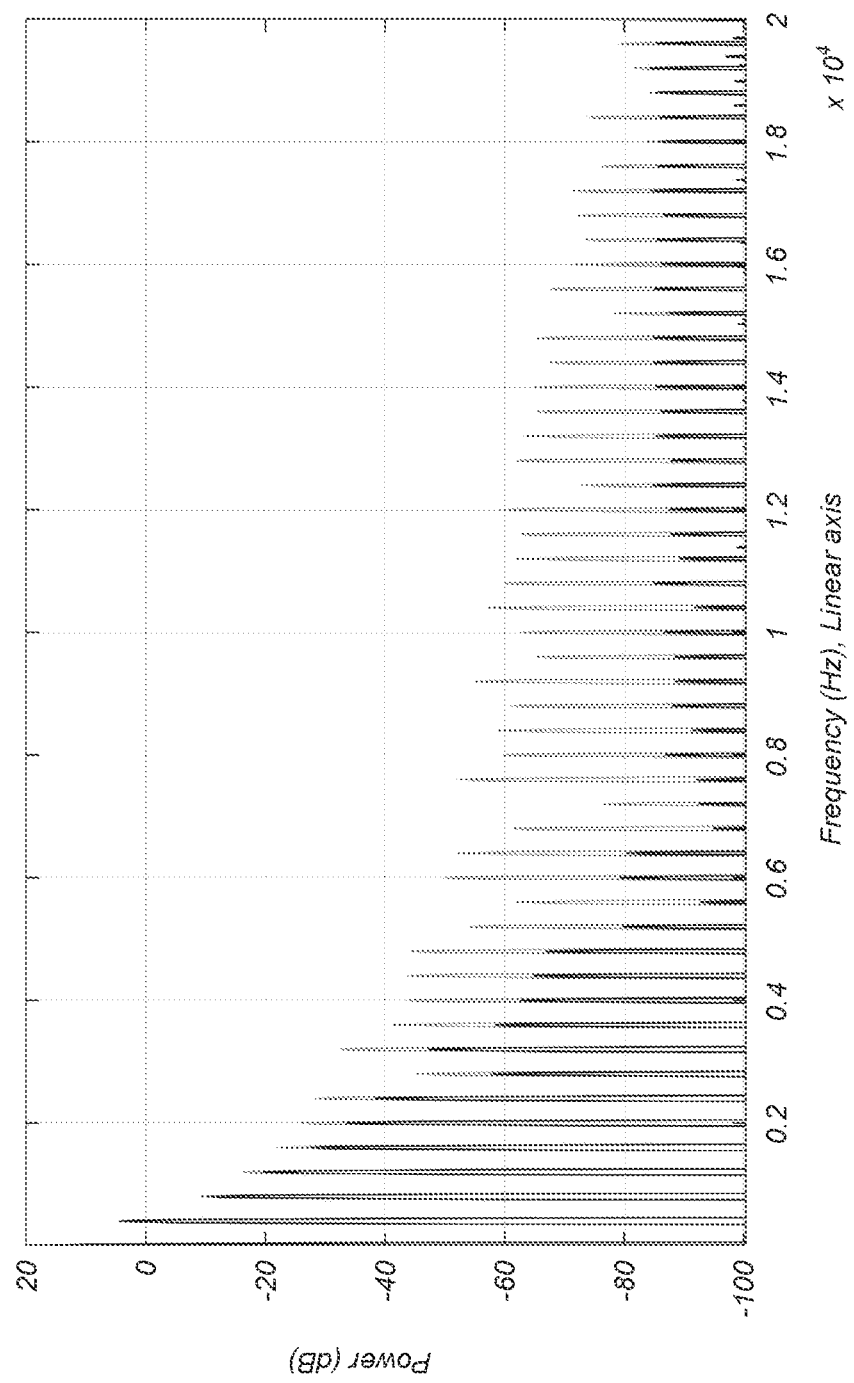
FIG. 3 shows a graph showing a power spectrum of the signals shown in FIG. 2.

In view of FIG. 2, the exemplary output signal has a similar waveform as the exemplary input signal, without significant differences in the wave properties, in particular the wave amplitude. This indicates that the acoustical noise suppression filter 6 does not filter the more relevant properties of the input signal. FIG. 3 illustrates the power spectrum of both signals shown in FIG. 2. A suppression of >16 dB is obtained at 4 kHz and the suppression increases further at higher frequencies. As such, the audible noise is sufficiently suppressed with the acoustical noise suppression filter 6.

It is noted that the example provided for the input and output signal in FIG. 2 is non-limiting, and the actual input and output signals are dependent on many factors e.g. the circuit board design, and thus, may comprise different signal properties and related waveforms.

Figure 5:
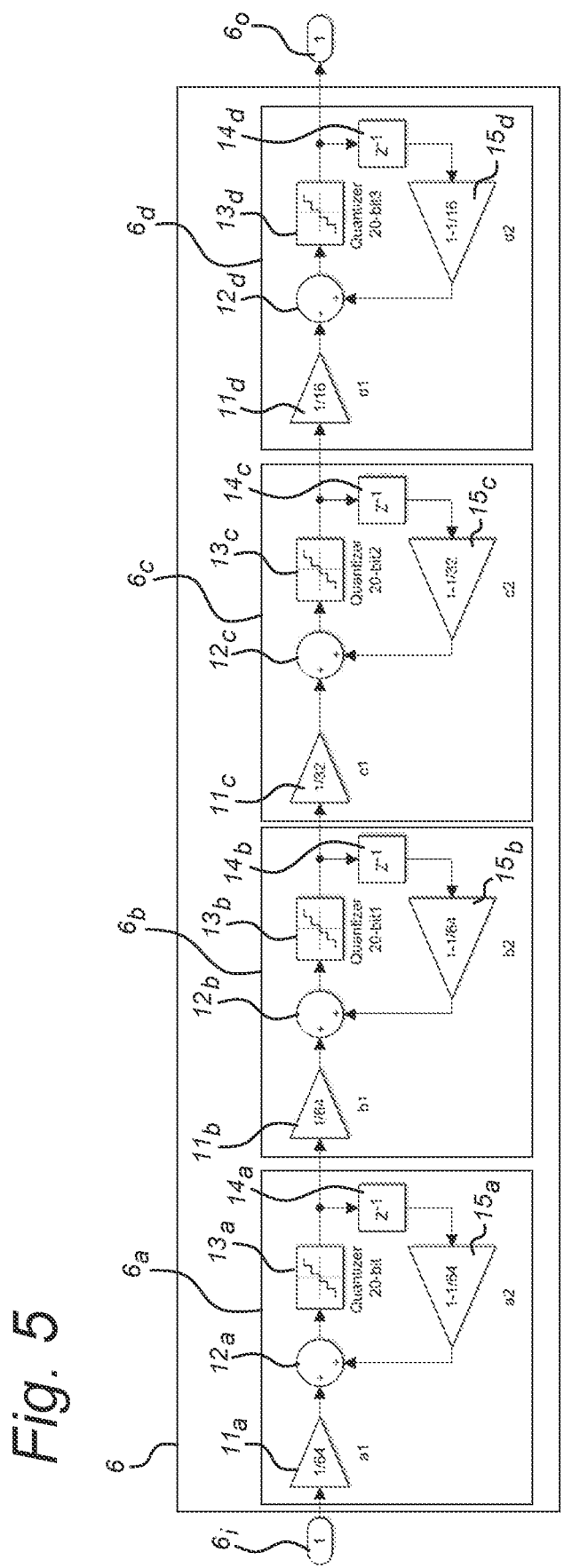
FIG. 5 shows a circuit diagram of an exemplary embodiment of the acoustical noise suppression filter according to the present disclosure.

In an exemplary embodiment shown in FIG. 5, the acoustical noise suppression filter 6 comprises a cascade of four first order filters $6_a$-$6_d$. Note that the acoustical noise suppression filter 6 in further embodiments comprises one, two or three first order filters. The cascade of four first order filters $6_a$-$6_d$ are connected in series. Each of the four first order filters $6_a$-$6_d$ is a circuit, comprising first amplifiers $11_a$-$11_d$ having first multiplication factors a1-d1, second amplifiers $15_a$-$15_d$ having second multiplication factors a2-d2, adders $12_a$-$12_d$, quantizers $13_a$-$13_d$ and delay elements $14_a$-$14_d$.

In the exemplary embodiment shown in FIG. 5, the first multiplication factors of a1, b1, c1 and d1 are equal to 1/64, 1/64, 1/32 and 1/16, respectively, and the second multiplication factors of a2, b2, c2, and d2 are equal to 1-1/64, 1-1/64, 1-1/32, and 1-1/16. The four quantizers $13_a$-$13_d$ in each of the four first order filters $6_a$-$6_d$ comprise, for example, a 20 bit quantizer, and the four delay elements $14_a$-$14_d$ in each of the four first order filters $6_a$-$6_d$ have, for example, a delay time of one bit time. The various components may be implemented digitally. It is noted that the multiplication factors (a1-d1; a2-d2), quantizer values ($13_a$-$13_d$) and delay element time (e.g. 1 second) as disclosed for the exemplary embodiment shown in FIG. 5 are described as a non-limiting example. In this respect, the exact values of the multiplication factors, quantizer values and delay element times may vary and depend on the specific application.

With the exception of the different multiplication factors just discussed above, the operation of the each of the four first order filters $6_a$-$6_d$ are similar to one another.

Figure 4:
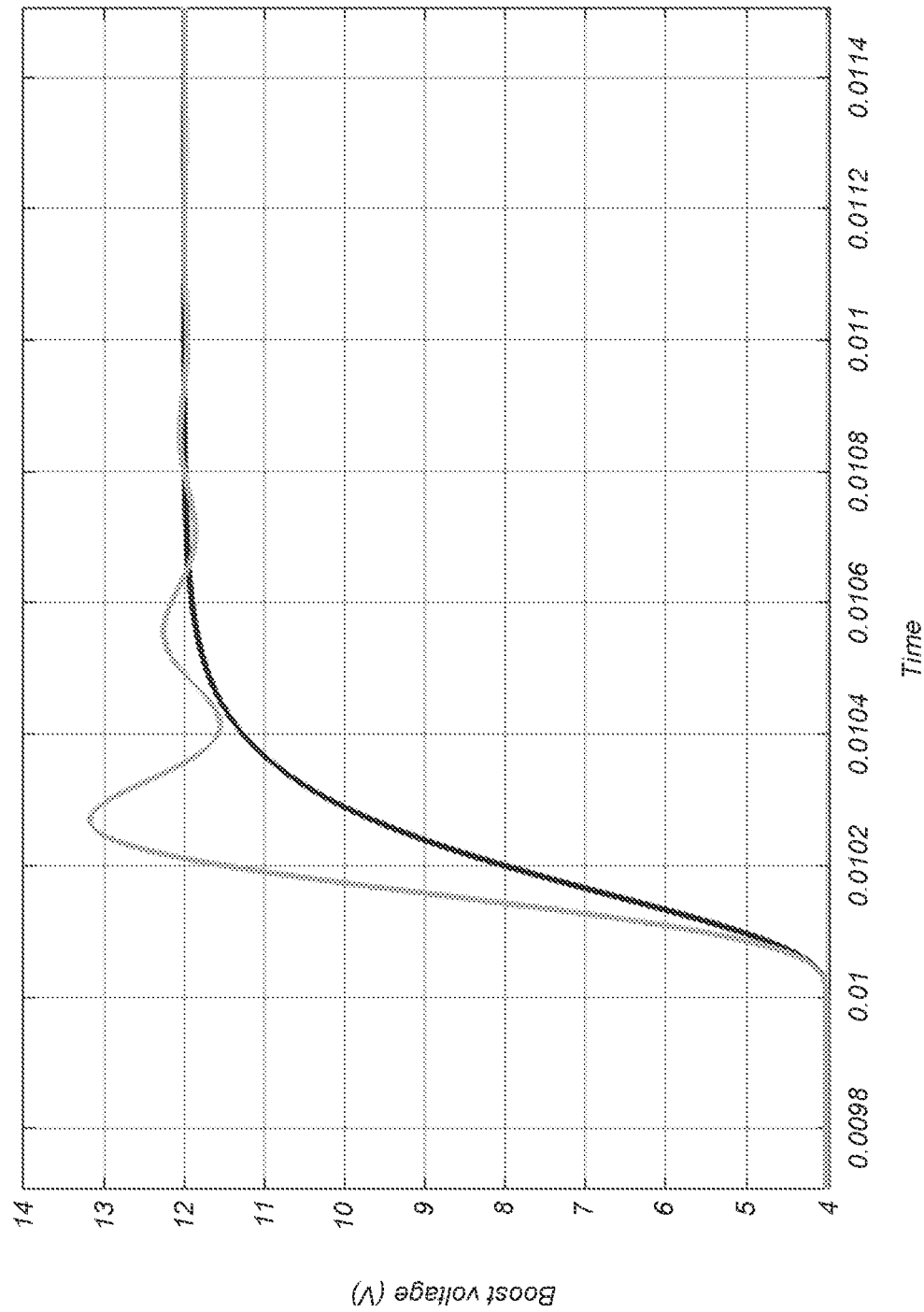
FIG. 4 shows step response graph of a filter with overshoot, and of a filter without overshoot.

In an further exemplary embodiment, the acoustical noise suppression filter 6 has an open loop transfer function with a phase margin of 90 degrees or more. In this embodiment, the acoustical noise suppression filter 6 stops any overshoot of the signal upon a step response i.e. boost voltage supply, whereby the acoustical noise suppression filter 6 can allow the voltage levels on the signal to gradually reach the desired voltage level. This is shown in the graph of FIG. 4, which shows a step response of an exemplary filter resulting in overshoot, and a step response without overshoot, which is the characteristic of the acoustical noise suppression filter 6 of the present disclosure embodiments, e.g. a filter 6 in the form of a cascade of four first order filters as shown in FIG. 5. In the absence of the open loop transfer function with a 90 degrees phase margin, an overshoot of the signal upon step response i.e. boost voltage supply would result in a sudden, high voltage level than desired, and this could damage e.g. the amplifier 2. Although the overshoot may be compensated by having e.g. a larger amplifier 2, this would require more circuit board space. As such, the acoustical noise suppression filter 6, having an open loop transfer function with a 90 degrees phase margin, provides many advantages in comparison to the solutions known in the art.

Exemplary embodiments of the disclosure in a further aspect relate to an electronic circuit comprising an adaptive DC-DC boost converter arrangement according to any one of the embodiments described above, wherein electronic circuit is one of an amplifier; an analog-to-digital converter; a digital-to-analog converter; a coder/decoder circuit; an RF circuit; a power amplifier; a voltage regulator.

In the exemplary embodiment shown in FIG. 1, the electronic circuit is an amplifier circuit 2 having an amplifier input $2_i$, a supply input $2_s$, and an amplifier output $2_o$, wherein the supply input $2_s$ is connected to the boost voltage output $4_o$, and the amplifier input $2_i$ is connected to the control input 5i. The boost voltage output $4_o$ has a signal with an adapted voltage level, as adapted by the adaptive DC-DC boost converter circuit 3. As the boost voltage output $4_o$ is connected to the supply input $2_s$, the amplifier circuit 2 receives the supply input $2_s$, with the adapted voltage level of the signal present on the boost voltage output $4_o$.

The amplifier circuit also receives the amplifier input $2_i$, where the amplifier circuit 2 processes both the amplifier input $2_i$ and supply input $2_s$, and outputs the resulting signal as an amplifier output $2_o$. A load 9 receives the amplifier output $2_o$. The load 9 may comprise, for example, a loudspeaker or an antenna.

In the exemplary embodiment shown in FIG. 1, the plurality of electronic components further comprises a delay line 7 connected to an input of the electronic circuit. The delay line 7 allows sufficient time for the adaptive DC-DC boost converter circuit 3 to process an input signal, adapt the voltage levels thereon, and output the boost voltage output $4_o$. In this respect, the operation of the delay line 7 is separate to the operation of the DC-DC boost converter circuit 3, and thus, no role is played by the delay 7 in the processing of the input signal in the DC-DC boost converter circuit 3. In absence of the delay line 7, the amplifier input $2_i$ may be fed into the amplifier circuit 2 and output as an amplifier output $2_o$, before the supply input $2_s$ is able to be fed timely into the amplifier circuit 2 for further processing with the amplifier input $2_i$. In a specific embodiment, the delay line 7 has a delay time equal to a settling time of the adaptive DC-DC boost converter circuit 3. The settling time of the DC-DC boost converter circuit 3 is a design parameter, which is used to provide the correct design implementation parameters of the delay line 7. This allows the electronic circuit to perform as efficiently as possible, without any surplus delay in the processing. In an exemplary embodiment, the DC-DC boost converter circuit 3 could be arranged to ramp-up with a rate of 15 kV per second. With this typical ramp-up speed, it would take 500 μs to attain 10V, starting from a 2.5V battery voltage: (10−2.5)/15E3=500E−6. The length of the delay-line 7 that should compensate for this ramp-up time therefore is e.g. about 500 μs. Limiting the ramp-up speed to 15 kV per second, or even lower, is motivated by reduction of the battery current required during ramping-up.

The present disclosure has been described above with reference to a number of exemplary embodiments as shown in the drawings. Modifications and alternative implementations of some parts or elements are possible, and are included in the scope of protection as defined in the appended claims.

What is claimed is:

1. An adaptive DC-DC boost converter arrangement comprising
a circuit board with a plurality of electronic components mounted thereon, the plurality of electronic components comprising:
an adaptive DC-DC boost converter circuit and a boost decoupling capacitor connected to an output of the adaptive DC-DC boost converter circuit, the adaptive DC-DC boost converter circuit comprising:
a DC-DC boost converter having a converter set value input, a boost supply input, and a boost voltage output;
an adaptive DC-DC boost control unit having a control input and a control output; and
an acoustical noise suppression filter having a filter input connected to the control output of the adaptive DC-DC boost control unit and a filter output connected to the converter set value input of the DC-DC boost converter,
wherein the boost decoupling capacitor is a ceramic capacitor, and the acoustical noise suppression filter is configured to filter out resonance frequencies of the circuit board caused by varying voltages applied to the boost decoupling capacitor mounted on the circuit board, and the acoustical noise suppression filter has a pass bandwidth of less than 4 kHz.

2. An adaptive DC-DC boost converter arrangement according to claim 1, wherein the adaptive DC-DC boost control unit is arranged to determine a converter set value for inputting to the converter set value input of the DC-DC boost converter, the converter set value being proportional to a signal level present on the control input.

3. An adaptive DC-DC boost converter arrangement according to claim 1, wherein the acoustical noise suppression filter is a low pass filter.

4. An adaptive DC-DC boost converter arrangement according to claim 1, wherein the acoustical noise suppression filter has a pass bandwidth of less than 1 kHz.

5. An adaptive DC-DC boost converter arrangement according to claim 1, wherein the pass bandwidth is dependent on the physical size of the boost decoupling capacitor.

6. An adaptive DC-DC boost converter arrangement according to claim 5, wherein the physical size of the boost decoupling capacitor is inversely dependent on the pass bandwidth, wherein if the physical size of the boost decoupling capacitor is larger, the resonance frequencies of the circuit board shift to lower frequencies, and the acoustical noise suppression filter is a lower-pass filter with smaller pass bandwidth.

7. An adaptive DC-DC boost converter arrangement according to claim 1, wherein the acoustical noise suppression filter is a bandpass filter and an upper cut-off frequency of the bandpass filter is less than 4 kHz.

8. An adaptive DC-DC boost converter arrangement according to claim 1, wherein the acoustical noise suppression filter is a fourth order low pass filter.

9. An adaptive DC-DC boost converter arrangement according to claim 1, wherein the acoustical noise suppression filter comprises a cascade of four first order filters.

10. An adaptive DC-DC boost converter arrangement according to claim 1, wherein the acoustical noise suppression filter has an open loop transfer function with a phase margin of 90 degrees or more.

11. An adaptive DC-DC boost converter arrangement according to claim 1, wherein the acoustical noise suppression filter stops any overshoot of the signal upon a step response.

12. An adaptive DC-DC boost converter arrangement according to claim 9, wherein the cascade of four first order filters are connected in series.

13. An adaptive DC-DC boost converter arrangement according to claim 12, wherein each of the four first order filters is a circuit comprising first amplifiers having first multiplication factors, second amplifiers having second multiplication factors, adders, quantizers and delay elements; and the first multiplication factors of are equal to $\frac{1}{64}$, $\frac{1}{64}$, $\frac{1}{32}$ and $\frac{1}{16}$, respectively, and the second multiplication factors, and d2 are equal to $1-\frac{1}{64}$, $1-\frac{1}{64}$, $1-\frac{1}{32}$, and $1-\frac{1}{16}$.

14. An adaptive DC-DC boost converter arrangement according to claim 13, wherein the four quantizers in each of the four first order filters comprise a 20 bit quantizer, and the four delay elements in each of the four first order filters have a delay time of one bit time.

15. An adaptive DC-DC boost converter arrangement according to claim 1, wherein the acoustical noise suppression filter is a fourth order low pass filter with a pass bandwidth of 1 kHz.

16. An electronic circuit comprising an adaptive DC-DC boost converter arrangement according to claim 1, wherein the electronic circuit is one of an amplifier, an analog-to-digital converter, a digital-to-analog converter, a coder/decoder circuit, an RF circuit, a power amplifier, and a voltage regulator.

17. An electronic circuit according to claim 16, wherein the plurality of electronic components further comprises a delay line connected to an input of the electronic circuit.

18. An electronic circuit according to claim 17, wherein the delay line has a delay time equal to a settling time of the adaptive DC-DC boost converter circuit.

19. An electronic circuit according to claim 16, wherein the electronic circuit is an amplifier circuit having an amplifier input, a supply input, and an amplifier output, wherein the supply input is connected to the boost voltage output and the amplifier input is connected to the control input.

* * * * *